United States Patent
Li et al.

(10) Patent No.: US 12,374,566 B2
(45) Date of Patent: Jul. 29, 2025

(54) TURNAROUND MECHANISM OF SILICON WAFERS

(71) Applicant: HANGZHOU ZHONGWEI PHOTOELECTRIC TECHNOLOGY CO., LTD., Hangzhou (CN)

(72) Inventors: Hong Li, Hangzhou (CN); Jiangshui Zhang, Hangzhou (CN); Jian Jing, Hangzhou (CN); Jun Wang, Hangzhou (CN); Guangquan Zhang, Hangzhou (CN); You Huang, Hangzhou (CN); Zhe Liu, Hangzhou (CN); Yongjian Fang, Hangzhou (CN); Pucha Hu, Hangzhou (CN); Xiaoying Zhu, Hangzhou (CN)

(73) Assignee: HANGZHOU ZHONGWEI PHOTOELECTRONIC TECHNOLOGY CO., LTD., Hangzhou (CN)

( * ) Notice: Subject to any disclaimer, the term of this patent is extended or adjusted under 35 U.S.C. 154(b) by 605 days.

(21) Appl. No.: 17/899,641

(22) Filed: Aug. 31, 2022

(65) Prior Publication Data
US 2023/0005775 A1    Jan. 5, 2023

Related U.S. Application Data

(63) Continuation of application No. PCT/CN2022/101208, filed on Jun. 24, 2022.

(30) Foreign Application Priority Data

Jul. 1, 2021    (CN) .......................... 202110746252.9
Aug. 2, 2021   (CN) .......................... 202110882165.6

(51) Int. Cl.
*H01L 21/67*    (2006.01)
*H01L 21/02*    (2006.01)
(Continued)

(52) U.S. Cl.
CPC .... *H01L 21/67051* (2013.01); *H01L 21/0206* (2013.01); *H01L 21/67706* (2013.01);
(Continued)

(58) Field of Classification Search
CPC ......... H01L 21/67742; H01L 21/68707; H01L 21/67766; H01L 21/67196;
(Continued)

(56) References Cited

U.S. PATENT DOCUMENTS 6,558,109 B2 *  5/2003  Gibbel ................. B65G 47/918
                                                    414/797
2001/0046435 A1 * 11/2001 Gibbel ................. B65G 47/918
                                                    414/797
(Continued)

FOREIGN PATENT DOCUMENTS

CN    202181120 U  *  4/2012
CN    210634980 U     5/2020
(Continued)

OTHER PUBLICATIONS

International Search Report of PCT/CN2022/101208.

*Primary Examiner* — Joel D Crandall

(57) ABSTRACT

A turnaround mechanism of silicon wafers is provided. The turnaround mechanism includes a material frame, a supporting component, a second clamping component. The frame is provided with a material tank. The supporting component includes at least one first clamping component, and each of the at least one first clamping component is configured to clamp or release a support. The second clamping component includes two first rotating shafts disposed oppositely and two second clamping members, the two first rotating shafts are rotatably connected to the material frame, the two second clamping members are correspondingly disposed on the two first rotating shafts respectively, and each of the two second clamping members can rotate with a corresponding first (Continued)

rotating shaft, enabling the two second clamping members to move toward each other to clamp the silicon wafers to be separated.

10 Claims, 6 Drawing Sheets

(51) Int. Cl.
*H01L 21/673* (2006.01)
*H01L 21/677* (2006.01)
*H01L 21/687* (2006.01)

(52) U.S. Cl.
CPC .. *H01L 21/67742* (2013.01); *H01L 21/67766* (2013.01); *H01L 21/67057* (2013.01); *H01L 21/67086* (2013.01); *H01L 21/67313* (2013.01); *H01L 21/68707* (2013.01); *Y02P 70/50* (2015.11)

(58) Field of Classification Search
CPC ......... H01L 21/67745; H01L 21/67748; H01L 21/68; H01L 21/67161; B25J 11/0095; B25J 15/0014; B65G 49/07; B24B 37/345
See application file for complete search history.

(56) References Cited

U.S. PATENT DOCUMENTS

| | | | |
|---|---|---|---|
| 2015/0357213 | A1* | 12/2015 | Yokoyama ........ H01L 21/67742 |
| | | | 134/32 |
| 2021/0398834 | A1* | 12/2021 | Shen ....................... B08B 7/026 |

FOREIGN PATENT DOCUMENTS

| | | | | |
|---|---|---|---|---|
| CN | 212659520 | U | 3/2021 | |
| CN | 113488423 | A | 10/2021 | |
| CN | 215869321 | U | 2/2022 | |
| CN | 114628296 | A | 6/2022 | |
| JP | 2020161509 | A | 10/2020 | |
| KR | 20120068044 | A * | 6/2012 | ....... H01L 21/67742 |

* cited by examiner

TURNAROUND MECHANISM OF SILICON WAFERS

CROSS-REFERENCE TO RELATED APPLICATIONS

This application is a continuation of international patent application No. PCT/CN2022/101208 filed on Jun. 24, 2022, which itself claims priority to Chinese patent applications No. 202110746252.9, filed on Jul. 1, 2021, titled "DEVICE FOR DEGUMMING AND INSERTING SILICON WAFERS", and No. 202110882165.6, filed on Aug. 2, 2021, titled "TURNAROUND MECHANISM OF SILICON WAFERS". The contents of the above identified applications are hereby incorporated herein in their entireties by reference.

TECHNICAL FIELD

The present disclosure relates to a field of a photovoltaic technology, and in particular, to a turnaround mechanism of silicon wafers.

BACKGROUND

In a production process of silicon wafers, a silicon bar is firstly cut into a plurality of silicon wafers by a wire cut electrical discharge machine, and the silicon wafers are glued to a support via a resin plate at this time. In order to degum the silicon wafers from the support, the support and the silicon wafers glued thereon must be transported to a degumming mechanism for degumming, so as to separate the silicon wafers from the support. Finally, the separated silicon wafers are transported to an inserting mechanism for splitting and inserting thereof.

In a related art, the support is usually transported into the degumming machine for degumming the silicon wafers from the support. After degumming, the separated silicon wafers are placed in a degumming tank, and the silicon wafers can be tilted and damaged easily in the degumming tank. The separated silicon wafers are then taken out from the degumming mechanism and put into an elastic clip by hand for transportation. When the separated silicon wafers are transported by the elastic clip, the silicon wafers are prone to tilt in the elastic clip. Therefore, a plurality of silicon wafers can be tilted and squeezed against each other, causing the silicon wafers to crack or produce fragments, which seriously reduces quality of the silicon wafers.

SUMMARY

According to various embodiments of the present disclosure, the present disclosure provides a turnaround mechanism of silicon wafers configured for turnaround of a support unit. The support unit includes a support and silicon wafers to be separated from the support. The turnaround mechanism includes a material frame, a supporting component and a second clamping component. The material frame is provided with a material tank which is configured to accommodate the support unit. The supporting component includes at least one first clamping component, and each of the at least one first clamping component includes two first clamping members disposed on the material frame. An adjustable clamping space is defined between the two first clamping members, the support is located in the clamping space, and the at least one first clamping component is configured to clamp or release the support. The second clamping component is disposed in the material tank and located under the supporting component along a height direction of the material frame. The second clamping component includes two first rotating shafts and two second clamping members. The two first rotating shafts are disposed oppositely, which are rotatably connected to the material frame, and the two second clamping members are disposed oppositely, which are flexible members. The two second clamping members are correspondingly disposed on the two first rotating shafts respectively, and each of the two second clamping members is capable of rotating with a corresponding first rotating shaft, enabling the two second clamping members to move toward each other to clamp the silicon wafers to be separated which is located at the support.

In some embodiments, the material frame includes an upper material frame and a lower material frame which are divided, the support component is disposed on the upper material frame, and the second clamping component is disposed on the lower material frame.

In some embodiments, the second clamping component further includes a mounting shaft, and the mounting shaft is mounted on the first rotating shaft along an axis of the first rotating shaft. The second clamping member is sleeved on the mounting shaft, and the second clamping member is rotatable relative to the mounting shaft. When the first rotating shaft rotates, the first rotating shaft is capable of driving the mounting shaft and the second clamping member to move toward each other.

In some embodiments, the turnaround mechanism of silicon wafers further includes a first driving component and two connecting rod components. One end of each of the two connecting rod components is connected to the first driving component, and the other end of each of the two connecting rod components is connected to a corresponding one of the two first rotating shafts located on the same side of the material tank. The first driving component is capable of moving to drive the two connecting rod components to move, so as to simultaneously drive the two first rotating shafts of the second clamping component to rotate toward or opposite to each other.

In some embodiments, each of the two connecting rod components includes a first connecting rod, a second connecting rod and a third connecting rod. One end of the first connecting rod is pivotally connected to one of the two first rotating shafts, and each of the two first rotating shafts is corresponding to one first connecting rod. The other end of the first connecting rod is rotatably connected to the second connecting rod. One end of the third connecting rod is rotatably connected to the second connecting rod and the other end of the third connecting rod is connected to the first driving component.

In some embodiments, the first driving component includes a sliding groove and a sliding block, the sliding groove extends along the height direction of the material frame, the sliding block is mounted in the sliding groove and capable of sliding relative to the sliding groove, and the third connecting rod is connected to the sliding block. The sliding block is capable of moving along the height direction of the material frame to drive the second clamping component to clamp or release the silicon wafers.

In some embodiments, the first driving component further includes a first limiting component, the first limiting component includes two first limiting blocks, and the two first limiting blocks are located at two sides of the sliding groove respectively. The sliding block is capable of moving to abut against the first limiting block, and the first limiting block is configured to limit a displacement of the sliding block along the height direction of the material frame.

In some embodiments, the supporting component further includes two supporting shafts, ends of the two supporting shafts are connected to two ends of the material frame respectively. The two supporting shafts are located at two opposite sides of the material tank respectively, and the two first clamping members are rotatably mounted on the two supporting shafts respectively.

In some embodiments, the supporting component further includes at least one second limiting component, each of the at least one second limiting component includes a lower limiting block and an upper limiting block, and each of the two first clamping members correspondingly matches a corresponding second limiting component. Along the height direction of the material frame, the lower limiting block is located below a corresponding first clamping member, and when the corresponding first clamping member rotates to abut against the lower limiting block, the lower limiting block is capable of restricting the corresponding first clamping member from rotating. The upper limiting block is disposed above the corresponding first clamping member, the upper limiting block is connected to a corresponding supporting shaft, and when the corresponding first clamping member rotates to abut against the upper limiting block, the upper limiting block is capable of restricting the corresponding first clamping member from rotating.

In some embodiments, the supporting component further includes a second driving component, and the second driving component includes two sliding rails and a driving unit. The two sliding rails are disposed at two ends of the material frame respectively, the two first clamping members of each of the at least one first clamping component are mounted on the same sliding rail, and the driving unit is configured to drive the two first clamping members to slide along the same sliding rail.

The details of one or more embodiments of the present disclosure are set forth in the accompanying drawings and the description below. Other features, objects and advantages of the present disclosure will become apparent from the description, drawings and claims.

BRIEF DESCRIPTION OF THE DRAWINGS

In order to better describe and explain the embodiments and/or examples of those disclosures disclosed herein, one or more drawings may be referred to. The additional details or examples used to describe the drawings should not be considered as limiting the scope of any of the disclosed disclosures, the currently described embodiments and/or examples, and the best mode of these disclosures currently understood.

Figure 1:
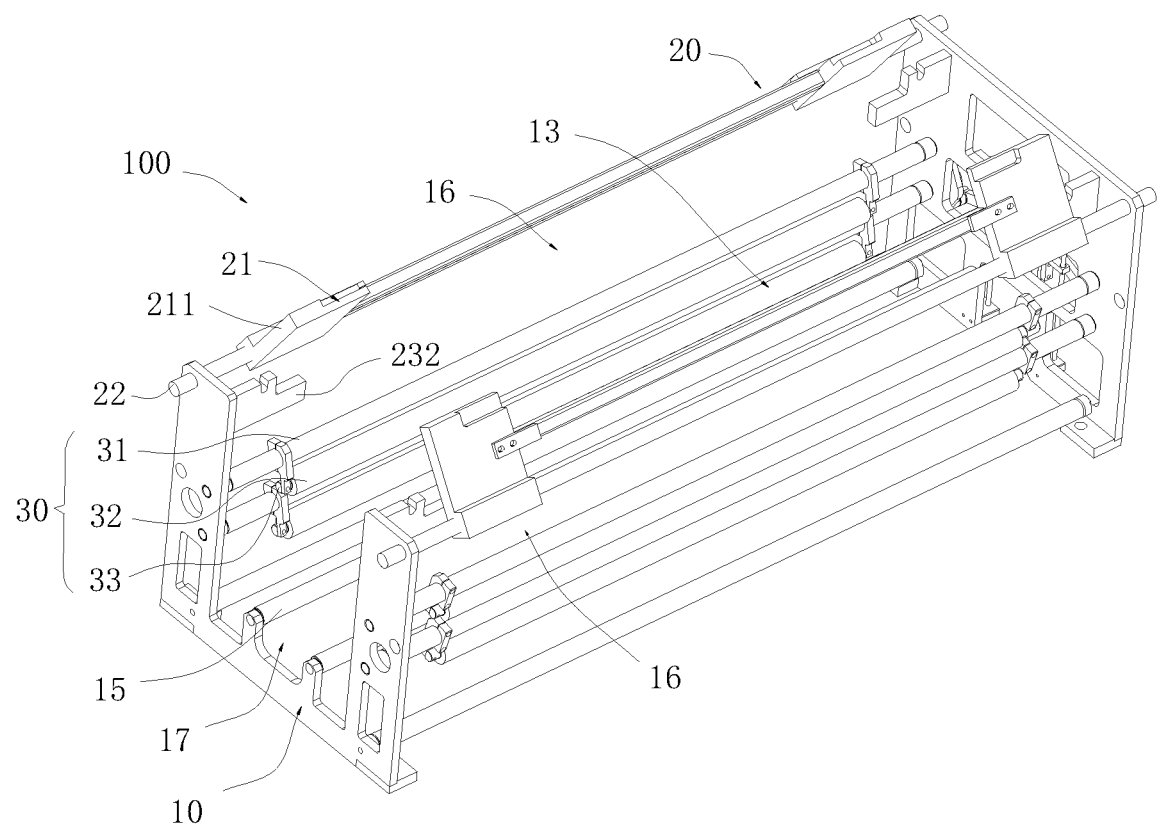
FIG. 1 is a schematic diagram of a turnaround mechanism of silicon wafers in one or more embodiment of the present disclosure.

In the figure, 100 represents a turnaround mechanism of silicon wafers, 10 represents a material frame, 11 represents an upper material frame, 12 represents a lower material frame, 13 represents a material tank, 14 represents a discharge port, 15 represents a supporting rod, 16 represents a first through groove, 17 represents a second through groove, 20 represents a supporting component, 21 represents a first clamping component, 211 represents a first clamping member, 22 represents a supporting shaft, 23 represents a second limiting component, 231 represents an upper limiting block, 232 represents a lower limiting block, 24 represents an elastic reset member, 25 represents a third limiting component, 251 represents an outer limiting block, 252 represents an inner limiting block, 26 represents a second driving component, 261 represents a sliding rail, 262 represents a driving unit, 30 represents a second clamping component, 31 represents a first rotating shaft, 32 represents a second clamping member, 33 represents a mounting shaft, 40 represents a first driving component, 41 represents a sliding groove, 42 represents a sliding block, 43 represents an elastic member, 44 represents a first limiting component, 441 represents a first limiting block, 50 represents a connecting rod component, 51 represents a first connecting rod, 52 represents a second connecting rod, 53 represents a third connecting rod, 200 represents a support, 201 represents a clamping groove, 300 represents a silicon wafer, 400 represents a mechanism for conveying and dispersing silicon wafers, 401 represents a conveying support component, 4011 represents a second bracket, 4012 represents a second belt, 402 represents a conveying clamping component, 4021 represents a conveying clamping member, 4022 represents a first bracket, 403 represents an accommodating area, and 500 represents a support unit.

DETAILED DESCRIPTION

Hereinafter, the technical solutions in the embodiments of the present disclosure will be clearly and completely described with reference to the accompanying drawings in the embodiments of the present disclosure. Obviously, the described embodiments are merely a part of the embodiments of the present disclosure, rather than all the embodiments. Based on the embodiments of the present disclosure, all other embodiments obtained by one skilled in the art without creative efforts all belong to the scope of protection of the present disclosure.

It should be noted that when an element is referred to as being "disposed on" another element, it may be directly disposed on the other element or a further element may be presented between them. When an element is referred to as being "arranged on" another element, it may be directly arranged on the other element or a further element may be presented between them. When an element is considered to be "connected" to another element, it may be directly connected to the other element or a further element may be presented between them.

Unless otherwise defined, all technical and scientific terms used herein have the same meaning as one skilled in the art would understand. The terminology used in the description of the present disclosure is for the purpose of describing particular embodiments and is not intended to limit the disclosure. As used herein, the term "or/and" includes any and all combinations of one or more related listed items.

In a related production process of silicon wafers, a support unit can be usually placed into a conventional material frame, and the conventional material frame can be transferred to a degumming mechanism for degumming. The support unit includes a support and silicon wafers to be separated from the support. After degumming, the silicon wafers separated from the support can be taken out from the degumming mechanism by hand and put into an elastic clip, and the elastic clip can be put into an inserting mechanism for inserting silicon wafers. However, the silicon wafers are usually ultra-thin and has a high mechanical brittleness, thus the silicon wafers are extremely fragile. The conventional material frame cannot clamp the support and the silicon wafers, resulting in that the silicon wafers are prone to tilt and crack when the silicon wafers are separated from the support during a degumming process. In a related art, in order to carry out a subsequent inserting process, the separated silicon wafers need to be transported to an elastic clip, and the elastic clip need to be put into the inserting mechanism for inserting silicon wafers. But the elastic clip also cannot clamp the support and the silicon wafers, resulting in the silicon wafers tilting and squeezing against each other to crack during a transport process.

The present disclosure provides a turnaround mechanism 100 of silicon wafers configured for turnaround of a support unit 500. Referring to FIG. 1 to FIG. 7, in the present disclosure, the turnaround mechanism 100 of silicon wafers includes a material frame 10, a supporting component 20 and a second clamping component 30.

The material frame 10 is provided with a material tank 13 which is configured to accommodate the support unit 500. The supporting component 20 includes at least one first clamping component 21, and each of the at least one first clamping component 21 includes two first clamping members 211 disposed on the material frame 10. An adjustable clamping space is defined between the two first clamping members 211, the support 200 is located in the clamping space, and the two first clamping members 211 is configured to move toward or opposite to each other to clamp or release the support 200. The second clamping component 30 is disposed in the material tank 13 and located under the supporting component 20 along a height direction of the material frame 10.

Specifically, the second clamping component 30 includes two first rotating shafts 31 and two second clamping members 32. The two first rotating shafts 31 are disposed at intervals in the material tank 13 oppositely, and rotatably connected to the material frame 10. The two second clamping members 32 are flexible members, and correspondingly disposed on the two first rotating shafts 31 respectively. Each of the two second clamping members 32 is capable of rotating with a corresponding first rotating shaft 31, enabling the two second clamping members 32 to move toward each other to clamp silicon wafers 300 to be separated which is located at the support 200.

In the turnaround mechanism 100 of silicon wafers provided by the present disclosure, the supporting component 20 and the second clamping component 30 are provided. When the support 200 and the silicon wafers 300 are transported for degumming, the support 200 can be placed in the material tank 13, and supported and clamped by the supporting component 20, thus preventing the support 200 from sliding and shifting. Furthermore, when the first clamping component 21 clamps the support 200, the second clamping component 30 can also clamp the silicon wafers 300 to be separated which are located at the support 200 correspondingly. After degumming, the silicon wafers 300 separated from the support 200 can be always clamped by the second clamping component 30, so as to prevent the silicon wafers 300 from tilting and prevent the silicon wafers 300 from being squeezed against each other and cracked. Moreover, in a subsequent process flow, the material frame 10 in the degumming mechanism can be directly transported without the elastic clip. During the subsequent transport process, the silicon wafers 300 can be placed in the material frame 10 and clamped all the time, which can effectively prevent the silicon wafers 300 from cracking in the transport process.

Figure 2:
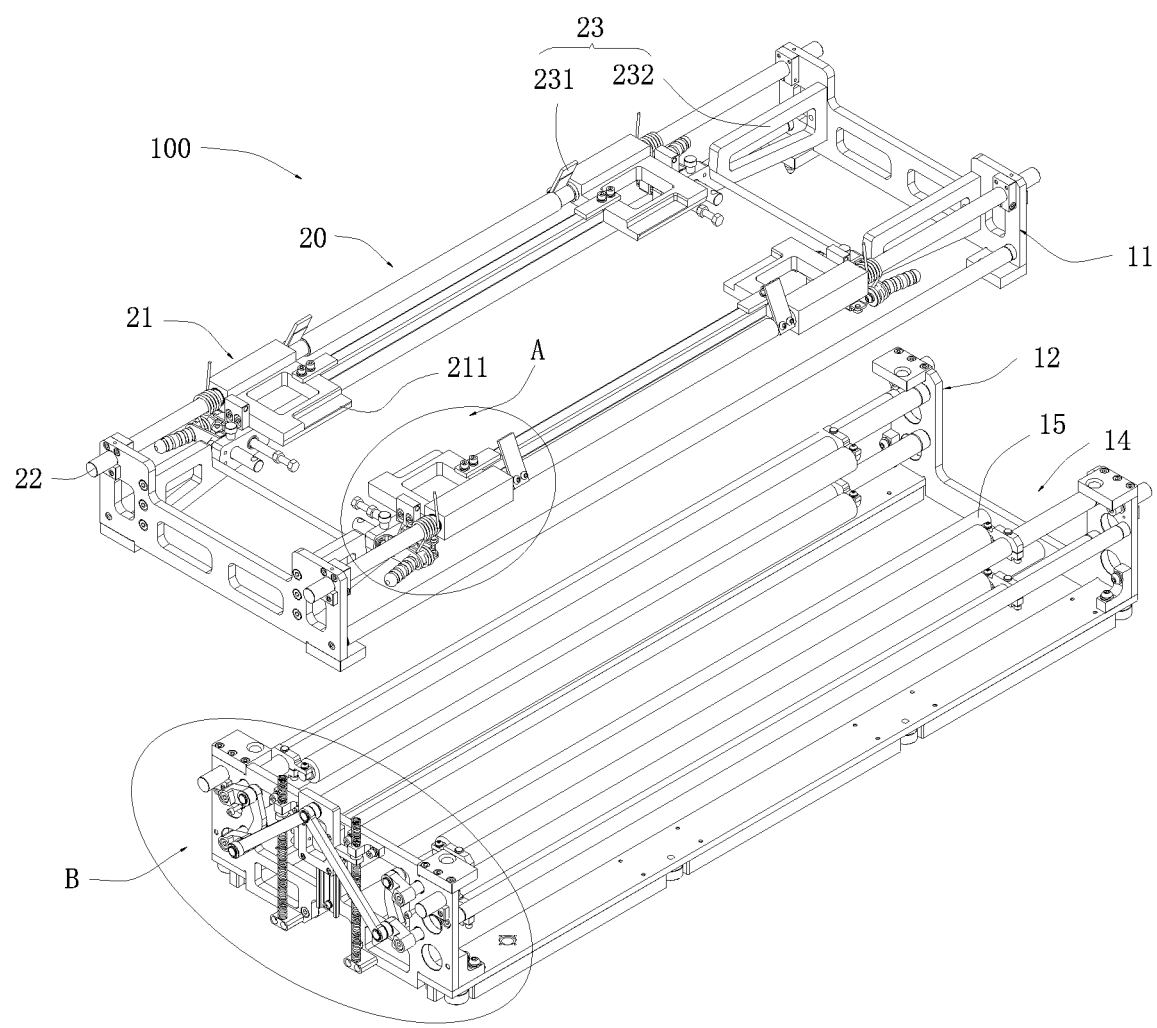
FIG. 2 is a schematic diagram of a turnaround mechanism of silicon wafers in one or more embodiment of the present disclosure.
Figure 7:
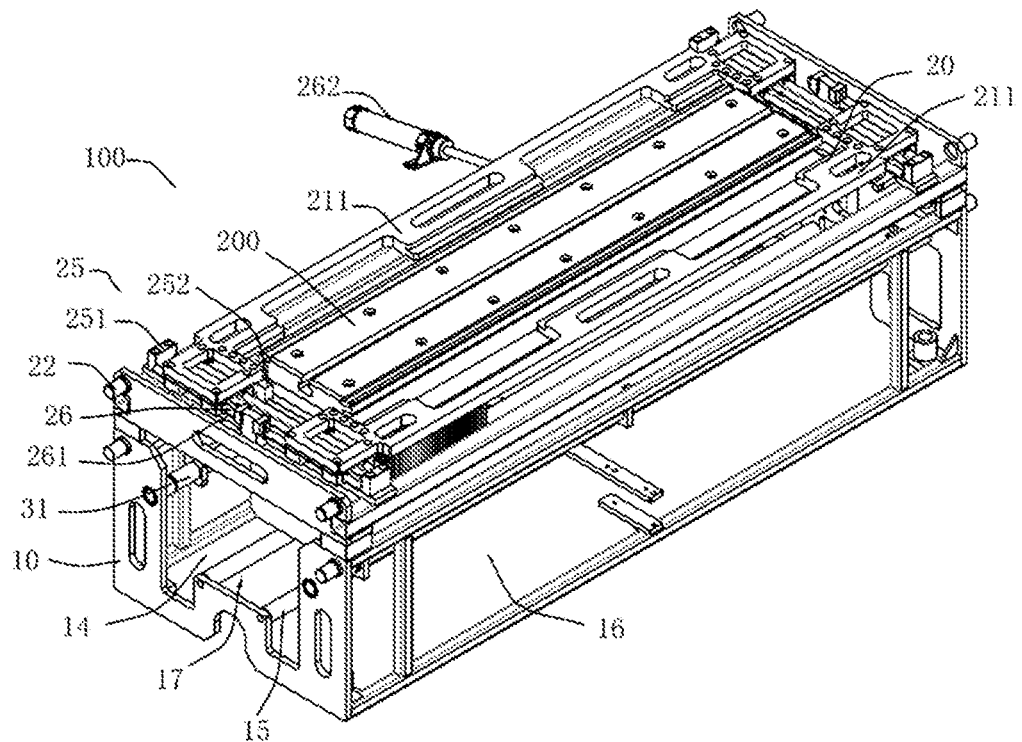
FIG. 7 is a schematic diagram of a turnaround mechanism of silicon wafers in one or more embodiment of the present disclosure.

Referring to FIG. 1, FIG. 2 and FIG. 7, the material frame 10 can be provided with a discharge port 14, and a position of the discharge port 14 can be adapted to the inserting mechanism. The silicon wafers 300 can be transported from the material frame 10 to the inserting mechanism via the discharge port 14. So that after degumming the silicon wafers 300, the silicon wafers 300 in the material frame 10 can be transported to the inserting mechanism by transporting the turnaround mechanism 100 of silicon wafers directly, thereby reducing turnaround times of the silicon wafers 300.

In some embodiment, referring to FIG. 1 to FIG. 8, a mechanism 400 for conveying and dispersing silicon wafers can be provided between the degumming mechanism (not shown) and the inserting mechanism. The mechanism 400 for conveying and dispersing silicon wafers can transport the silicon wafers 300 in the turnaround mechanism 100 of silicon wafers to the inserting mechanism, and structures of the turnaround mechanism 100 of silicon wafers and the mechanism 400 for conveying and dispersing silicon wafers are adapted to each other. Two first through grooves 16 can be disposed on both sides of the material frame 10 respectively, the two first through grooves 16 can be in communication with the material tank 13 and be disposed oppositely. In addition, a second through groove 17 can be disposed on a bottom of the material frame 10 and be in communication with the material tank 13. The first through groove 16 and the second through groove 17 can be adapted to the mechanism 400 for conveying and dispersing silicon wafers respectively. In this way, since the structures of the turnaround mechanism 100 of silicon wafers and the mechanism 400 for conveying and dispersing silicon wafers are adapted to each other, after degumming, there is no need to take out the silicon wafers in the material frame 10, and the material frame 10 in the degumming mechanism and the separated silicon wafers 300 in the material frame 10 can be directly transferred to the mechanism 400 for conveying and dispersing silicon wafers to reduce the turnaround times of the silicon wafers 300, thereby reducing fragmentation rate of the silicon wafers 300.

By a cooperation of the turnaround mechanism 100 of silicon wafers, the mechanism 400 for conveying and dispersing silicon wafers and the inserting mechanism, the support unit 500 before degumming can be accommodated in the turnaround mechanism 100 of silicon wafers. The turnaround mechanism 100 of silicon wafers together with the support unit 500 can be transported into the degumming mechanism to complete the degumming process. The separated silicon wafers 300 can be directly transferred to the mechanism 400 for conveying and dispersing silicon wafers by the turnaround mechanism 100 of silicon wafers. At this time, the mechanism 400 for conveying and dispersing silicon wafers can cooperate with the turnaround mechanism 100 of silicon wafers, so that the mechanism 400 for conveying and dispersing silicon wafers can directly transport the silicon wafers 300 in the material frame 10 to the inserting mechanism via the discharge port 14, thereby omitting a turnaround step of the silicon wafers, and reducing the fragmentation rate of the silicon wafers 300.

In an embodiment, referring to FIG. 1 to FIG. 8, the mechanism 400 for conveying and dispersing silicon wafers can include a conveying support component 401 and a conveying clamping component 402, which are both in a cyclic scrolling arrangement. The conveying clamping component 402 can include two conveying clamping members 4021, and the two conveying clamping members 4021 can be disposed oppositely on both sides of the conveying support component 401. An accommodating area 403 capable of accommodating the turnaround mechanism 100 of silicon wafers can be defined between the conveying support component 401 and the conveying clamping component 402. The two first through grooves 16 can be disposed on both sides of the material frame 10 respectively and disposed oppositely, and the two first through grooves 16 can be in communication with the material tank 13. The second through groove 17 can be disposed on the bottom of the material frame 10, and be in communication with the material tank 13. During the transport process, the turnaround mechanism 100 of silicon wafers can be placed in the accommodating area 403, and the two conveying clamping members 4021 can extend into the two first through grooves 16 respectively and move toward each other to clamp the silicon wafers in the material tank 13. The conveying support component 401 can correspondingly extend into the second through groove 17 to support the silicon wafers 300 in the material frame 10. The conveying support component 401 can cooperate with the two conveying clamping members 4021 to clamp and support the silicon wafers 300 in the material frame 10, so that the silicon wafers 300 can be released from the material frame 10 and conveyed into the inserting mechanism.

Alternatively, a groove width of the first through groove 16 can be greater than or equal to that of the corresponding conveying clamping member 4021.

Figure 8:
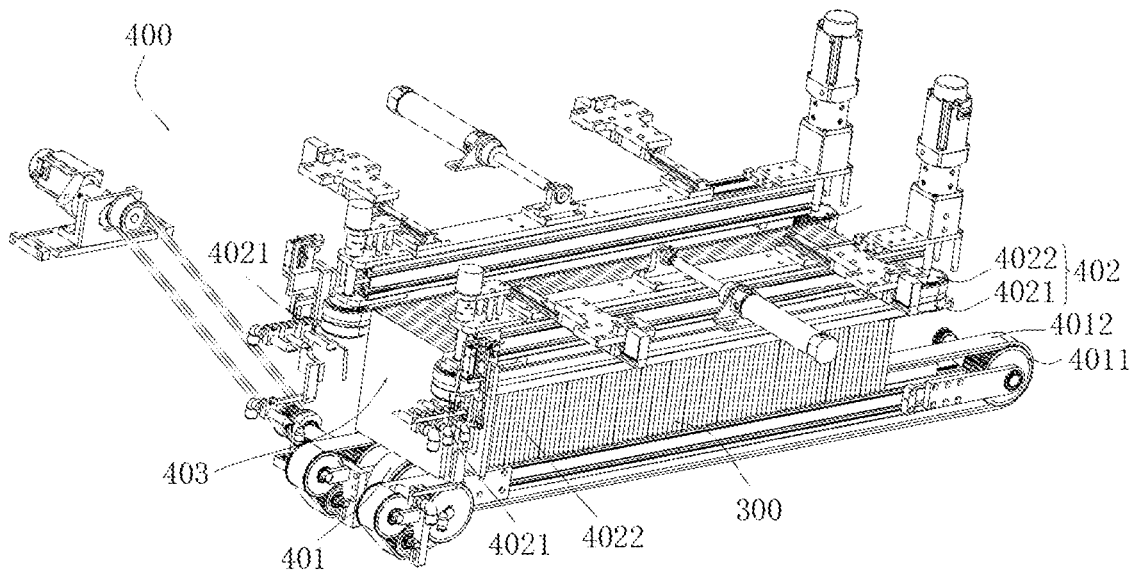
FIG. 8 is a schematic diagram of a mechanism for conveying and dispersing silicon wafers in a related art.

Furthermore, referring to FIG. 8, the conveying clamping member 4021 can be a first belt. The conveying clamping component 402 can further include two first brackets 4022, and the two first brackets 4022 can be located on both sides of the conveying support component 401 respectively. The first belt can be sleeved on the first bracket 4022, and scroll on the first bracket 4022 cyclically. In other embodiments, the specific structure of the conveying clamping component 402 is not limited to those described above or shown in the drawings.

Referring to FIG. 8, in an embodiment, the conveying support component 401 can include a second bracket 4011 and a second belt 4012. The second belt 4012 can be sleeved on the second bracket 4011 and scroll on the second bracket 4011 cyclically.

Alternatively, referring to FIG. 1, a plurality of supporting rods 15 can be provided at bottom of the material tank 13, and the silicon wafers 300 in the material tank 13 can be supported by the supporting rods 15. The second through groove 17 can be defined between the plurality of supporting rods 15 arranged at intervals. The groove width of the second through groove 17 can be adapted to the mechanism 400 for conveying and dispersing silicon wafers. In other embodiments, the definition of the second through groove 17 is not limited to those described above or shown in the drawings.

Alternatively, the supporting rod 15 can be covered with flexible material to prevent the supporting rod 15 from scratching edges of the silicon wafers 300. In an embodiment, referring to FIG. 1 and FIG. 2, the bottom of the material frame 10 can be a hollow structure, in other words, the bottom of the material tank 13 can be a hollow structure to adapt to the degumming process. In the degumming process, the support 200 and the material frame 10 need to be immersed in clean water and degumming agent, and the hollow structure can facilitate the clean water and/or the degumming agent to leak in or out the material frame 10.

Referring to FIG. 1, in an embodiment, the material frame 10 can be combined as an integrity structure.

In other embodiments, referring to in FIG. 2, the material frame 10 can be a split structure. The material frame 10 can include an upper material frame 11 and a lower material frame 12 which are divided, the support component 20 can be disposed on the upper material frame 11, and the second clamping component 30 can be disposed on the lower material frame 12. In this way, after the degumming process is completed, the upper material frame 11 and the support 200 can be directly taken out, and the lower material frame 12 and the silicon wafers 300 in the lower material frame 12 can be directly transported to the subsequent inserting mechanism, thereby reducing weight of the material frame 10 during a transportation from the degumming mechanism to the inserting mechanism. In practical applications, an overall weight of the material frame 10 can be relatively large. By the split structure, only the lower material frame 12 needs to be transported, which is convenient for carry and transportation.

In the present disclosure, the supporting component 20 can include a plurality of first clamping components 21. For example, referring to FIG. 1 and FIG. 2, the number of the first clamping components 21 is two. Both ends of the support 200 can be clamped by the two first clamping components 21 respectively, preventing the support 200 from shifting during the transportation and avoiding collision and damage to the silicon wafers 300. In other embodiments, more than two first clamping components 21 can also be provided.

Referring to FIG. 1 to FIG. 4, the supporting component 20 can further include two supporting shafts 22, ends of the two supporting shafts 22 can be connected to two ends of the material frame 10 respectively, and the two supporting shafts 22 can be located at two opposite sides of the material tank 13 respectively. The two first clamping members 211 of each of the at least one first clamping component 21 are rotatably mounted on the two supporting shafts respectively. By driving the two first clamping members 211 to rotate toward each other, the support 200 located between the two first clamping members 211 can be clamped.

Figure 5:
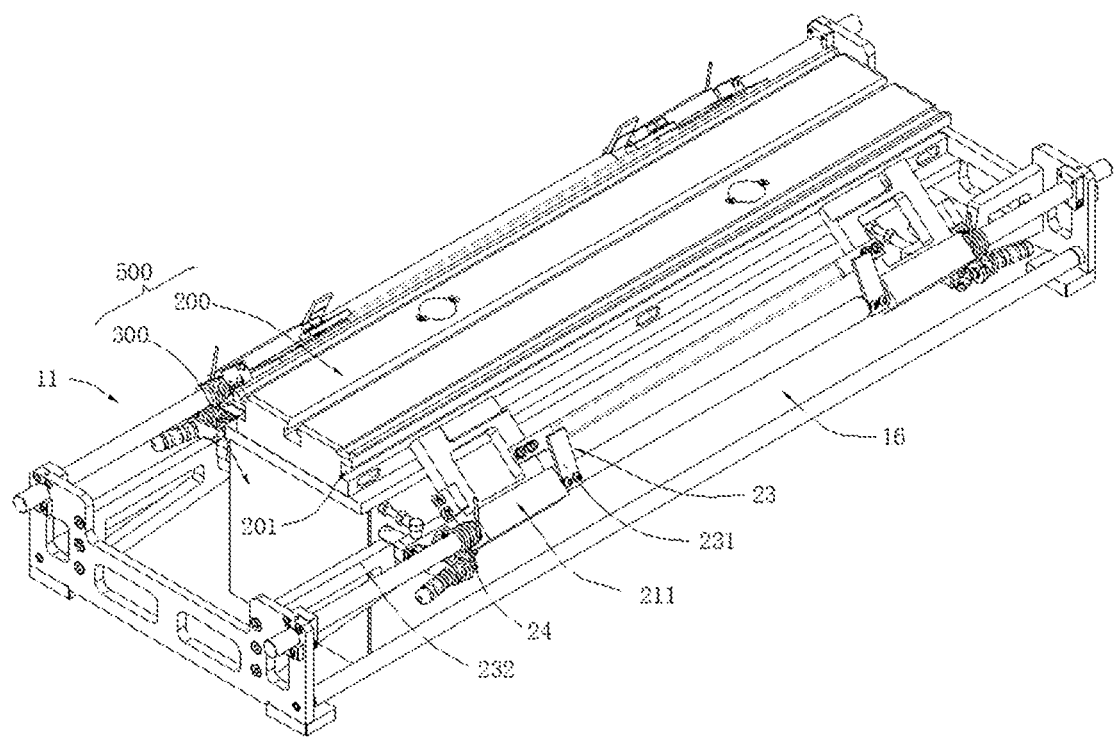
FIG. 5 is a schematic diagram of an installation state of an upper material frame of a turnaround mechanism of silicon wafers in one or more embodiment of the present disclosure.

In an embodiment of the present disclosure, referring to FIG. 1, FIG. 2 and FIG. 5, two clamping grooves 201 are disposed on two sides of the support 200. Alternatively, the two first clamping members 211 can be a plate structure adapted to the two clamping grooves 201, and the two first clamping members 211 can rotate toward each other, so that ends of the first clamping members 211 can extend into the two clamping grooves 201 respectively. When the support 200 continues to move down into the material tank 13, the ends of the two first clamping members 211 can continue to extend toward the two clamping grooves 201 until the two first clamping members 211 rotates to a position with a preset angle, in which the two first clamping members 211 can fully extend into the two clamping grooves 201. The two clamping grooves 201 can cooperate with the two first clamping members 211 to clamp and support the support 200, thus preventing the support 200 from sliding relative to the material frame 10, and preventing the support 200 from continuing to move down and crushing the silicon wafers 300. In other embodiments, the specific structure of the two first clamping members 211 is not limited to the above, and can be adjusted according to the structure of the support 200.

Referring to FIG. 1 to FIG. 5, the supporting component 20 can further include at least one second limiting component 23, each of the at least one second limiting component 23 can include a lower limiting block 232 and an upper limiting block 231, and each of the two first clamping members 211 can correspondingly match a second limiting component 23. Along the height direction of the material frame 10, the lower limiting block 232 can be located below a corresponding first clamping member 211. When the corresponding first clamping member 211 rotates to abut against the lower limiting block 232, the lower limiting block 232 is capable of restricting the corresponding first clamping member 211 from rotating to the bottom of the material frame 10. In this way, the lower limiting block 232 and the first clamping member 211 can support the support 200 to prevent the support 200 from moving down. The upper limiting block 231 can be disposed above the corresponding first clamping member 211, and the upper limiting block 231 can be connected to a corresponding supporting shaft 22. When the corresponding first clamping member 211 rotates to abut against the upper limiting block 231, the upper limiting block 231 is capable of restricting the corresponding first clamping member 211 from rotating.

Figure 3:
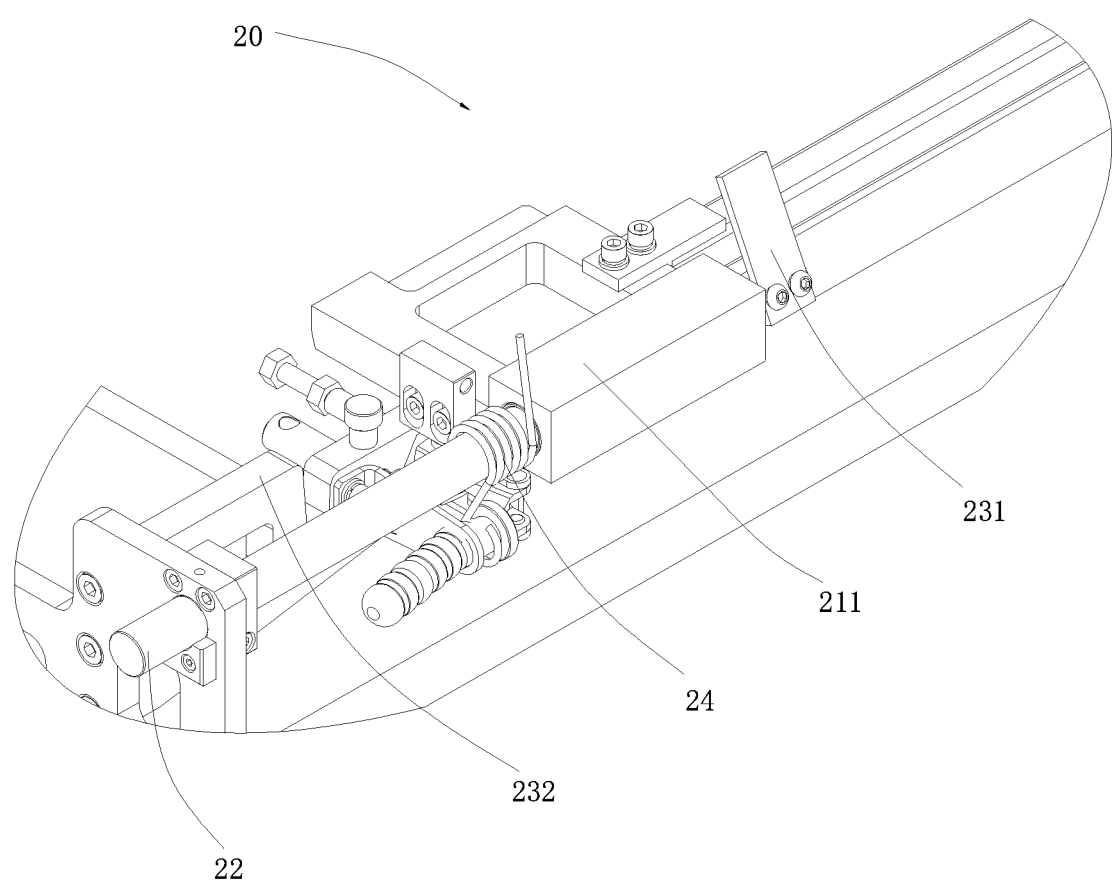
FIG. 3 is a partial enlarged diagram of portion "A" of FIG. 2.

Referring to FIG. 3, the supporting component 20 can also include an elastic reset member 24, one end of the elastic reset member 24 can be connected to the supporting shaft 22, and the other end thereof can be connected to the first clamping member 211. The elastic reset member 24 can always pull the first clamping member 211, so that one first clamping member 211 can rotate opposite to the other first clamping member 211 on the opposite side. When the support 200 is not placed in the material tank 13, the elastic reset member 24 can pull the first clamping component 21 to a released state. In other words, the elastic reset member 24 can always pull the first clamping member 211 to abut against the upper limiting block 231, so that the first clamping component 21 can be in the released state at this time. When the support 200 is placed in the material tank 13, the two first clamping members 211 can be located at notches of the corresponding clamping grooves 201 on both sides. The support 200 can be slowly moved down and placed into the material frame 10, and the corresponding first clamping member 211 clamped the support 200 can be pressed down by an inner wall of the clamping groove 201. Therefore, the one first clamping member 211 can overcome an elastic force of the elastic reset member 24, and rotate toward the other first clamping member 211 on the opposite side until the corresponding first clamping member 211 abuts against the lower limiting block 232, so that the support 200 can be clamped. When the support 200 is taken out from the material frame 10, the pressure exerted by the support 200 on the first clamping member 211 will disappear, so that the first clamping member 211 can return to the initial released state under an elastic restoring force of the elastic reset member 24. Therefore, an automatic resetting of the first clamping component 21 can be realized, so as to facilitate the clamping and support of the support 200 in a next production process of silicon wafers. In this way, an automatic clamping and the automatic resetting of the first clamping component 21 can be realized by the elastic restoring force of the elastic reset member 24 and gravity of the support 200 during a pressing process. Therefore, there is no need to provide power equipment such as driving motors, thereby simplifying the structure of the turnaround mechanism 100 of silicon wafers, saving power source, and reducing structural cost and energy consumption.

In some embodiments, the elastic reset member 24 can be a torsion spring. In other embodiments, the elastic reset member 24 can also be other elastic structures.

In some embodiments, the structure for realizing the clamping and resetting of the first clamping component 21 is not limited to the above. For example, in another embodiment of the present disclosure, referring to FIG. 6 and FIG. 7, the supporting component 20 can further include a second driving component 26. The second driving component 26 can include two sliding rails 261 and a driving unit 262. The two sliding rails 261 can be disposed at two ends of the material frame 10 respectively, the two first clamping members 211 of each of the at least one first clamping component 21 can be mounted on the same sliding rail 261, and the driving unit 262 can be configured to drive the two first clamping members 211 to slide along the same sliding rail 261. When the driving unit 262 drives the two first clamping members 211 to slide toward each other, the support 200 located between the two first clamping members 211 can be clamped. When the driving unit 262 drives the two first clamping members 211 to slide opposite to each other, the support 200 can be released. The driving unit 262 can be a driving device such as a motor, which is not limited.

Alternatively, the driving unit 262 can be a driving motor, a cylinder, etc., or other driving structures.

Figure 6:
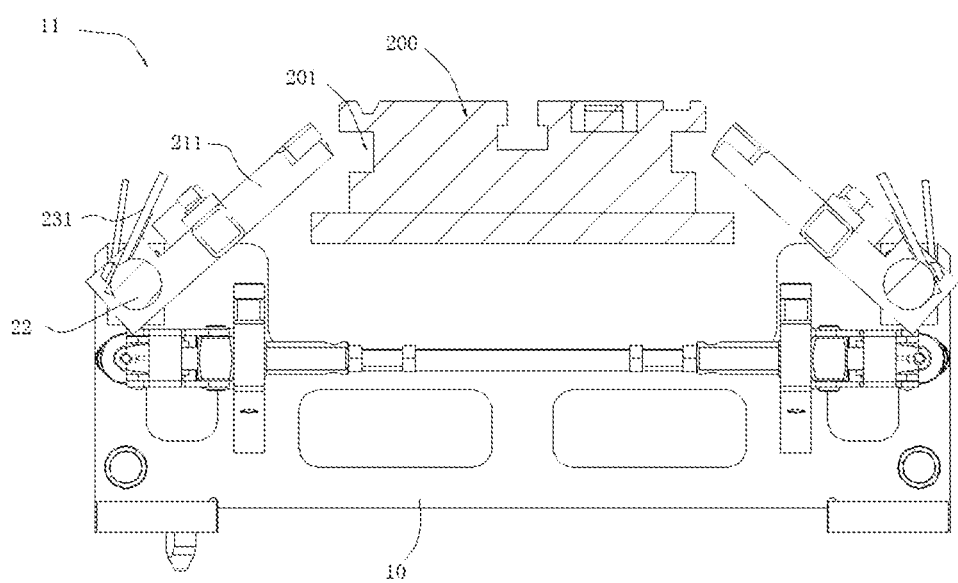
FIG. 6 is a cross-sectional diagram of the upper material frame of the turnaround mechanism of silicon wafers of FIG. 5.

Referring to FIG. 6, the supporting component 20 can further include at least one third limiting component 25, each of the at least one third limiting component 25 can include two inner limiting blocks 252 and two outer limiting blocks 251, and each of the two sliding rails 261 correspondingly matches a corresponding third limiting component 25. The two outer limiting blocks 251 can be located at both ends of the sliding rail 261 respectively, the two inner limiting blocks 252 can be located between the two outer limiting blocks 251, and the first clamping member 211 can be located between an outer limiting block 251 and an adjacent inner limiting block. A maximum distance between the two first clamping members 211 can be limited by the two outer limiting blocks 251, thus preventing the two first clamping members 211 from being disengaged from the sliding rail 261. A minimum distance between the two first clamping members 211 can be limited by the two inner limiting blocks 252, thus preventing the two first clamping members 211 from over-clamping the support 200.

Figure 4:
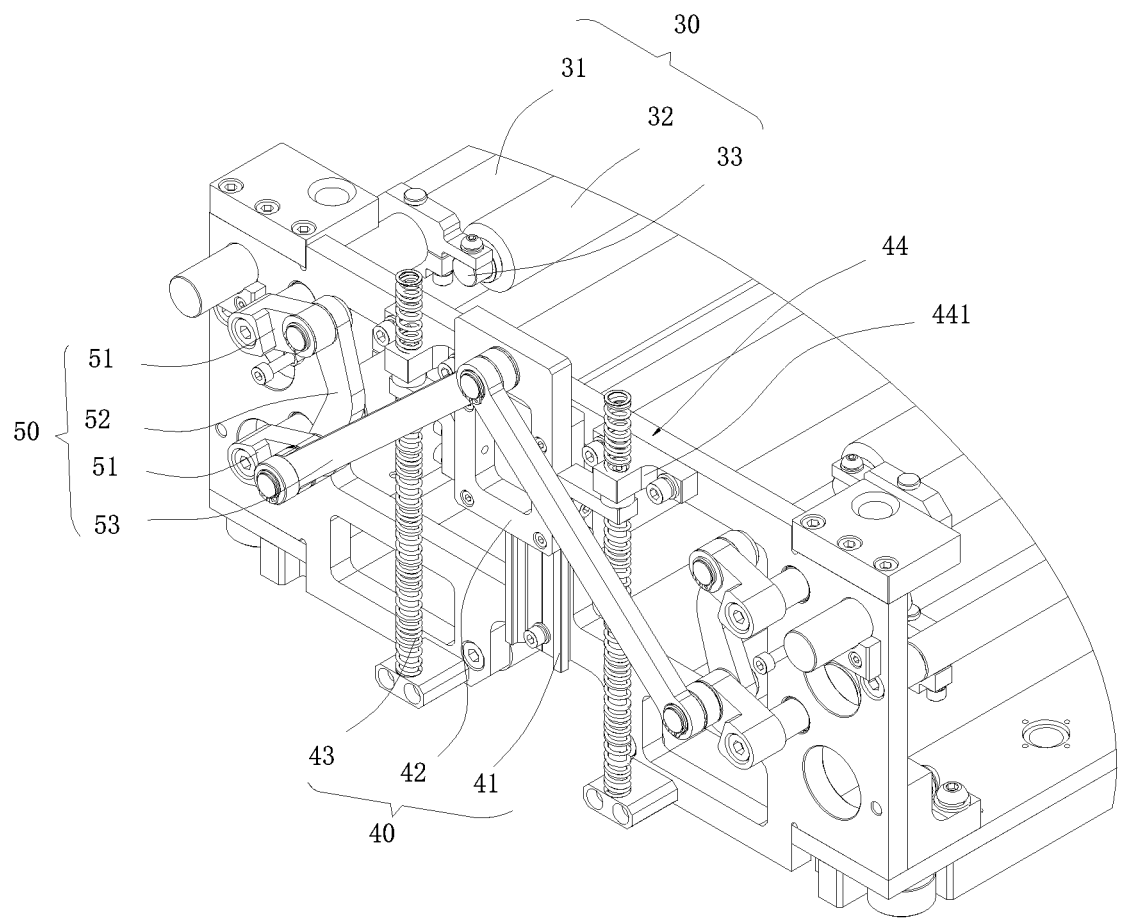
FIG. 4 is a partial enlarged diagram of portion "B" of FIG. 2.

In an embodiment of the present embodiment, referring to FIG. 1, FIG. 2 and FIG. 4, the second clamping component 30 can further include a mounting shaft 33. The mounting shaft 33 can be mounted on the first rotating shaft 31 along an axis of the first rotating shaft 31, the second clamping member 32 can be sleeved on the mounting shaft 33, and the second clamping member 32 can be rotatable relative to the mounting shaft 33. When the first rotating shaft 31 is driven to rotate, the first rotating shaft 31 is capable of driving the mounting shaft 33 and the second clamping member 32, and the two second clamping members 32 can move toward or opposite to each other. When the support 200 has been loaded, the two second clamping members 32 can clamp the silicon wafers 300 glued to the support 200, and then the turnaround mechanism 100 of silicon wafers can transport the support unit 500 in the material frame 10 to the degumming mechanism for degumming. After the degumming process is finished, the silicon wafers 300 can be separated from the support 200. Since the second clamping member 32 can be rotatable relative to the mounting shaft 33, after the silicon wafers 300 are separated from the support 200, the second clamping member 32 can be driven to rotate relative to the mounting shaft 33 under self-weight of the silicon wafers 300 and frictional force between the silicon wafers 300 and the second clamping member 32. So that driving the second clamping member 32 to rotate relative to the mounting shaft 33 can be achieved, and the silicon wafers 300 can be slowly moved down to abut against the bottom of the material tank 13. During the pressing process of the silicon wafers 300, the two second clamping members 32 can always clamp the silicon wafers 300, so that the silicon wafers 300 can be prevented from tilting while the silicon wafers 300 is moving down, and the silicon wafers 300 can be effectively prevented from being damaged due to colliding with each other.

Specifically, in some embodiments, the second clamping member 32 can include a sponge roller, and the sponge roller has a certain degree of softness to prevent the silicon wafers 300 from being scratched. Moreover, the sponge roller has good corrosion resistance, so that the turnaround mechanism 100 of silicon wafers can be immersed in the degumming tank together with the support unit 500.

Referring to FIG. 2 to FIG. 4, the turnaround mechanism 100 of silicon wafers can include a first driving component 40 and two connecting rod components 50. One end of each of the two connecting rod components 50 can be connected to the first driving component 40, and the other end of each of the two connecting rod components 50 can be connected to a corresponding one of the two first rotating shafts 31 located on the same side of the material tank 13. The first driving component 40 is capable of moving to drive the two connecting rod components 50 to move, so as to simultaneously drive the two first rotating shafts 31 of the second clamping component to rotate toward or opposite to each other.

Referring to FIG. 4, in some embodiments, the connecting rod component 50 can include a first connecting rod 51, a second connecting rod 52 and a third connecting rod 53. One end of the first connecting rod 51 can be pivotally connected to one of the two first rotating shafts 31, and each of the two first rotating shafts 31 can be corresponding to one first connecting rod 51. The other end of the first connecting rod 51 can be rotatably connected to the second connecting rod 52. One end of the third connecting rod 53 can be rotatably connected to the second connecting rod 52 and the other end of the third connecting rod 53 can be connected to the first driving component 40. The first driving component 40 can drive the third connecting rod 53 to rotate, the corresponding third connecting rod 53 can drive the second connecting rod 52 to move, then the second connecting rod 52 can drive the first connecting rod 51 to move, and the corresponding first connecting rod 51 can drive the first rotating shaft 31 to rotate. Thereby the two first rotating shafts 31 opposite to each other can rotate toward or opposite to each other, so as to clamp or release the silicon wafers. In other embodiments, the specific structure of the connecting rod component 50 is not limited to the above.

Alternatively, the number of the second clamping component 30 is not limited to one, and a plurality of second clamping components 30 can be provided, such as two second clamping components 30. Two first rotating shafts 31 located on the same side in the two second clamping components 30 can be pivotally connected to two corresponding first connecting rods 51 respectively, and the two first connecting rods 51 can be connected to the same second connecting rod 52. Therefore, the connecting rod component 50 can drive the two first rotating shafts 31 of the two second clamping components 30 to rotate at the same time, so as to realize a simultaneous clamping of the two second clamping components 30 and simplify the structure of the connecting rod component 50. In other embodiments, the plurality of second clamping components 30 can also be driven separately, which is not limited.

Referring to FIG. 4, the second connecting rod 52 can include a curved rod. In this way, when the second connecting rod 52 rotates, it can avoid ends of the first connecting rod 51 and the first rotating shaft 31, and prevent the first connecting rod 51 and the first rotating shaft 31 from obstructing the second connecting rod 52 to rotate.

Furthermore, referring to FIG. 4, in the present embodiment, the first driving component 40 can include a sliding groove 41 and a sliding block 42. The sliding groove 41 can extend along the height direction of the material frame 10, the sliding block 42 can be mounted in the sliding groove 41 and capable of sliding relative to the sliding groove 41, and the third connecting rod 53 can be connected to the sliding block 42. The sliding block is capable of moving along the height direction of the material frame 10 to drive the second clamping component 30 to clamp or release the silicon wafers.

Specifically, in the present embodiment, referring to FIG. 1 to FIG. 4, when the sliding block 42 moves toward the bottom of the material frame 10 along the height direction of the material frame 10, and the two second clamping members 32 of the second clamping component 30 can move opposite to each other, and the second clamping member 32 can be in the released state. When the sliding block 42 moves away from the bottom of the material frame 10 along the height direction of the material frame 10, the two second clamping members 32 of the second clamping component 30 can move toward each other, and the second clamping member 32 can be in a clamping state. In other embodiments, the relationship between the state of the second clamping component 30 and a moving direction of the sliding block 42 is not limited to the above. For example, when the sliding block 42 moves toward the bottom of the material frame 10, the second clamping component 30 can be in the clamping state.

Alternatively, referring to FIG. 4, the first driving component 40 can further include an elastic member 43, one end of the elastic member 43 can be connected to the sliding block 42, and the other end of the elastic member 43 can be connected to the bottom of the material frame 10. When the sliding block 42 is pressed down to move toward the bottom of the material frame 10, the second clamping component 30 can be in the released state. When the support 200 is loading, an external force applied to the sliding block 42 can be withdrawn, while the elastic member 43 can be reset due to elastic deformation, so as to drive the sliding block 42 to move away from the bottom of the material frame 10. Therefore, the sliding block 42 can drive the second clamping component 30 to clamp the silicon wafers automatically. By arranging the elastic member 43, the second clamping component 30 can be always in the clamping state when no external force is applied to the sliding block 42, so as to ensure that the second clamping component 30 can always clamp the silicon wafers during processes of degumming and transporting of the turnaround mechanism 100 of silicon wafers, thus preventing the silicon wafers from tilting, and reducing the energy consumption of the turnaround mechanism 100 of silicon wafers.

Referring to FIG. 4, the first driving component 40 can further include a first limiting component 44, the first limiting component 44 can include two first limiting blocks 441. The two first limiting blocks 441 can be located at two sides of the sliding groove 41 respectively. The sliding block 42 is capable of moving to abut against the first limiting block 441, and the first limiting block 441 can be configured to limit a displacement of the sliding block 42 along the height direction of the material frame 10. The first limiting component 44 can be disposed to prevent the second clamping component 30 from over-clamping the silicon wafers, thereby reducing a damage rate of the silicon wafers.

In summary, referring to FIG. 1 to FIG. 8, a process of applying the turnaround mechanism 100 of silicon wafers can be shown hereinafter.

Firstly, when the support unit 500 is not loading, the first clamping component 21 and the second clamping component 30 can be in a released state. Then, the support 200 can be slowly moved down along the height direction of the material frame 10, so that the first clamping member 211 can gradually extend into the clamping groove 201 on the sides of the support 200. At this time, in each of the at least one first clamping component 21, the two first clamping members 211 disposed oppositely can move toward each other and clamp the clamping support 200. When the first clamping member 211 abuts against the lower limiting block 232 or the inner limiting block 252, the clamping of the support 200 can be realized. At the same time, in each of the second clamping components 30, the two second clamping members 32 disposed oppositely can move toward each other and approach the unseparated silicon wafers on the support 200 until the second clamping member 32 abuts against the first limiting block 441 to clamp the silicon wafers 300. Moreover, the support unit 500 in the material frame 10 of the turnaround mechanism 100 of silicon wafers can be transported into the degumming mechanism. After degumming, the support 200 and the silicon wafers 300 can be separated. At this time, the support 200 or the support 200 together with the upper material frame 11 can be taken out, and the remaining degummed silicon wafers 300 together with the lower material frame 12 can be transported to the accommodating area 403 of the mechanism 400 for conveying and dispersing silicon wafers. At this time, the conveying support component 401 can extend into the second through groove 17 to support the silicon wafers 300, so that the bottom of the silicon wafers 300 can be separated from the bottom of the material tank 13. The two conveying clamping members 4021 disposed on both sides of the material tank 13 can extend into the two first through grooves 16 respectively, and move toward each other to clamp the silicon wafers in the material tank 13. At this time, the first driving component 40 of the turnaround mechanism 100 of silicon wafers can drive the second clamping member 32 to release the silicon wafers 300, so that the turnaround mechanism 100 of silicon wafers cannot clamp and support the silicon wafers 300. Then, the mechanism 400 for conveying and dispersing silicon wafers can be in operation, the conveying support component 401 and the conveying clamping component 402 can cyclically scroll, and transport the silicon wafers 300 located in the material tank 13 to the inserting mechanism via the discharge port 14 for inserting, thus finishing the transportation process of the silicon wafers 300. In a production process of silicon wafers, the turnaround mechanism 100 of silicon wafers provided by the present disclosure can effectively realize the clamping of the silicon wafers and prevent the silicon wafer from tilting. Furthermore, the turnaround mechanism 100 of silicon wafers can be applied in combination with the degumming mechanism and the inserting mechanism. Therefore, in the production process of silicon wafers, the silicon wafers can be always supported, clamped and transported by the material frame 10 without the elastic clip, so that the silicon wafers do not need multiple handling, thus significantly reducing a damage rate of the silicon wafers.

In addition, it should be noted that the use of words such as "first", "second" to limit parts is only for the convenience of distinguishing corresponding parts. If not otherwise stated, the above words have no special meaning. Therefore, it cannot be construed as a limitation on the protection scope of the present disclosure.

The technical features of the above-described embodiments may be combined in any combination. For the sake of brevity of description, not all possible combinations of the technical features in the above embodiments are described. However, as long as there is no contradiction between the combinations of these technical features, all should be considered as within the scope of this disclosure.

Those of ordinary skilled in the art should recognize that, the above-described embodiments are merely illustrative of the present disclosure, but is not to be construed as limiting the scope of the disclosure. A number of variations and modifications may be made without departing from the spirit all fall within the scope of this disclosure.

We claim:

1. A turnaround mechanism of silicon wafers configured for turnaround of a support unit, the support unit comprising a support and silicon wafers to be separated from the support, wherein the turnaround mechanism comprises:
   a material frame provided with a material tank, which is configured to accommodate the support unit;
   a supporting component comprising at least one first clamping component, wherein each of the at least one first clamping component comprises two first clamping members disposed on the material frame, an adjustable clamping space is defined between the two first clamping members, the support is located in the clamping space, and the at least one first clamping component is configured to clamp or release the support; and
   a second clamping component disposed in the material tank and located under the supporting component along a height direction of the material frame,
   wherein the second clamping component comprises:
     two first rotating shafts disposed oppositely, which are rotatably connected to the material frame; and
     two second clamping members disposed oppositely, which are flexible members,
     wherein the two second clamping members are correspondingly disposed on the two first rotating shafts respectively, and each of the two second clamping members is capable of rotating with a corresponding first rotating shaft, enabling the two second clamping members to move toward each other to clamp the silicon wafers to be separated which is located at the support.

2. The turnaround mechanism of silicon wafers of claim 1, wherein the material frame comprises an upper material frame and a lower material frame which are divided, the support component is disposed on the upper material frame, and the second clamping component is disposed on the lower material frame.

3. The turnaround mechanism of silicon wafers of claim 1, wherein the second clamping component further comprises a mounting shaft, the mounting shaft is mounted on the first rotating shaft along an axis of the first rotating shaft, the second clamping member is sleeved on the mounting shaft, the second clamping member is rotatable relative to the mounting shaft, and when the first rotating shaft rotates, the first rotating shaft is capable of driving the mounting shaft and the second clamping member to move toward each other.

4. The turnaround mechanism of silicon wafers of claim 1, further comprising a first driving component and two connecting rod components,
   wherein one end of each of the two connecting rod components is connected to the first driving component, and the other end of each of the two connecting rod components is connected to a corresponding one of the two first rotating shafts located on the same side of the material tank;
   the first driving component is capable of moving to drive the two connecting rod components to move, so as to simultaneously drive the two first rotating shafts of the second clamping component to rotate toward or opposite to each other.

5. The turnaround mechanism of silicon wafers of claim 4, wherein each of the two connecting rod components comprises:
   a first connecting rod, one end of which being pivotally connected to one of the two first rotating shafts, each of the two first rotating shafts being corresponding to one first connecting rod;
   a second connecting rod rotatably connected to the other end of the first connecting rod; and
   a third connecting rod, one end of which being rotatably connected to the second connecting rod and the other end of which being connected to the first driving component.

6. The turnaround mechanism of silicon wafers of claim 5, wherein the first driving component comprises a sliding groove and a sliding block, the sliding groove extends along the height direction of the material frame, the sliding block is mounted in the sliding groove and capable of sliding relative to the sliding groove, and the third connecting rod is connected to the sliding block;
   the sliding block is capable of moving along the height direction of the material frame to drive the second clamping component to clamp or release the silicon wafers.

7. The turnaround mechanism of silicon wafers of claim 6, wherein the first driving component further comprises a first limiting component, the first limiting component comprises two first limiting blocks, and the two first limiting blocks are located at two sides of the sliding groove respectively; the sliding block is capable of moving to abut against the first limiting block, and the first limiting block is configured to limit a displacement of the sliding block along the height direction of the material frame.

8. The turnaround mechanism of silicon wafers of claim 1, wherein the supporting component further comprises two supporting shafts, ends of the two supporting shafts are connected to two ends of the material frame respectively, the two supporting shafts are located at two opposite sides of the material tank respectively, and the two first clamping members are rotatably mounted on the two supporting shafts respectively.

9. The turnaround mechanism of silicon wafers of claim 8, wherein the supporting component further comprises at least one second limiting component, each of the at least one second limiting component comprises a lower limiting block and an upper limiting block, and each of the two first clamping members correspondingly matches a corresponding second limiting component,
   wherein along the height direction of the material frame, the lower limiting block is located below a corresponding first clamping member, and when the corresponding first clamping member rotates to abut against the lower limiting block, the lower limiting block is capable of restricting the corresponding first clamping member from rotating;
   the upper limiting block is disposed above the corresponding first clamping member, the upper limiting block is connected to a corresponding supporting shaft, and when the corresponding first clamping member rotates to abut against the upper limiting block, the upper limiting block is capable of restricting the corresponding first clamping member from rotating.

10. The turnaround mechanism of silicon wafers of claim 1, wherein the supporting component further comprises a second driving component, and the second driving component comprises two sliding rails and a driving unit;
   the two sliding rails are disposed at two ends of the material frame respectively, the two first clamping members of each of the at least one first clamping component are mounted on the same sliding rail, and the driving unit is configured to drive the two first clamping members to slide along the same sliding rail.

* * * * *